(12) United States Patent
Chung et al.

(10) Patent No.: US 6,657,275 B1
(45) Date of Patent: Dec. 2, 2003

(54) PAD AND VIA PLACEMENT DESIGN FOR LAND SIDE CAPACITORS

(75) Inventors: Chee-Yee Chung, Chandler, AZ (US); David G. Figueroa, Mesa, AZ (US); Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/366,439

(22) Filed: Aug. 2, 1999

(51) Int. Cl.$^7$ ............................................. H01L 29/00
(52) U.S. Cl. ..................... 257/503; 257/306; 257/307; 257/532
(58) Field of Search ................. 257/532, 503, 257/666, 301–308

(56) References Cited

U.S. PATENT DOCUMENTS

| | | | | | |
|---|---|---|---|---|---|
| 5,089,874 A | * | 2/1992 | Deguchi et al. | ............ | 257/532 |
| 5,220,194 A | * | 6/1993 | Golio | .......................... | 257/601 |
| 5,744,854 A | * | 4/1998 | Okada | .......................... | 257/532 |
| 5,780,930 A | * | 7/1998 | Malladi et al. | ............. | 257/532 |
| 5,828,106 A | * | 10/1998 | Sato | ............................ | 257/350 |
| 5,880,524 A | * | 3/1999 | Xie | ............................. | 257/503 |
| 5,982,018 A | * | 11/1999 | Wark | .......................... | 257/532 |
| 6,043,560 A | * | 3/2000 | Haley | .......................... | 257/503 |
| 6,094,144 A | * | 7/2000 | Dishongh | .................... | 257/48 |

* cited by examiner

Primary Examiner—Wael Fahmy, Jr.
Assistant Examiner—Nathan W. Ha
(74) Attorney, Agent, or Firm—Seth Z. Kalson

(57) ABSTRACT

An integrated circuit package and land side capacitor with reduced power delivery loop inductance. The capacitor pads have vias that lie underneath the land side capacitor, and have interposed digits.

14 Claims, 3 Drawing Sheets

PAD AND VIA PLACEMENT DESIGN FOR LAND SIDE CAPACITORS

FIELD

The present invention relates to integrated circuit packaging, and more particularly, to bypass capacitor pad design and pad via placement on an integrated circuit package.

BACKGROUND

As the clock frequency and clock signal edge rates of high performance microprocessors and integrated circuits increase, bypass (decoupling) capacitors play an increasingly important role in reducing system noise and suppressing unwanted radiation. To provide an effective bypassing solution, bypass capacitors may need to be placed on both the front side of an integrated circuit package and on the back side of the package directly underneath the die. A capacitor attached under an integrated circuit package is referred to as a land side capacitor (LSC).

FIG. 1 provides a prior-art, simplified edge-view illustration and schematic of bypass LSC 102 attached to integrated circuit package 116 having die 118. Bypass capacitor 102 is shown schematically as a lumped-parameter discrete capacitor connected to $V_{ss}$ pad 104 and $V_{cc}$ pad 106. Pad 104 is connected to $V_{ss}$ ground plane 108 by via 110 and pad 106 is connected to $V_{cc}$ power plane 112 by via 114. Pads 104 and 106 are usually of rectangular shape. For simplicity, the entire ground and power planes are not shown, and their connections to die 118 are not shown.

As clock speeds increase to 1 GHz and beyond, and clock signal rise times decrease down into the 100 ps regime, the power delivery design of prior art integrated circuit packages, such as that shown in FIG. 1, may lead to unacceptable loop inductance. Reducing the loop inductance of a power delivery system may reduce the number of required bypass capacitors, as well as increase the system yield, thereby reducing production costs. The present invention is motivated to address these issues.

SUMMARY

In one embodiment of the present invention, an integrated circuit package has two pads having interposed digits. Another embodiment of the present invention comprises a package having a first via coupling a first pad to a ground plane, a second via coupling a second pad to a power plane, and a capacitor connected to the first and second pads, where the first and second vias lie underneath the capacitor.

DESCRIPTION OF EMBODIMENTS

Figure 1:
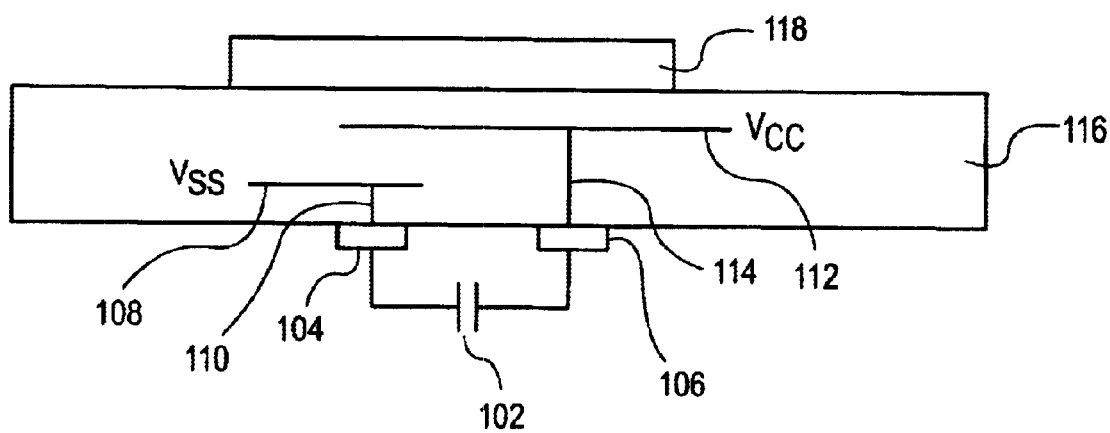
FIG. 1 illustrates a prior art integrated circuit package with a land side, lumped-parameter capacitor.
Figure 2A:
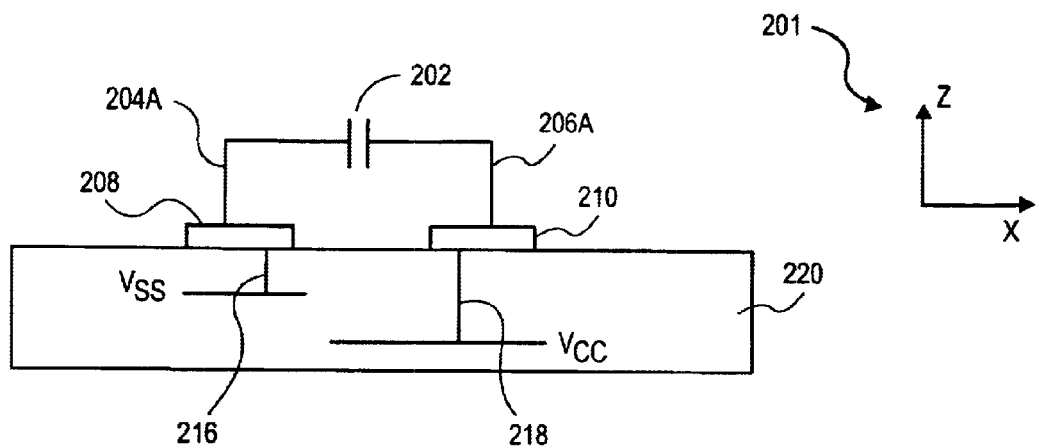
FIGS. 2a and 2b provide views of two embodiments of the present invention.
Figure 2B:
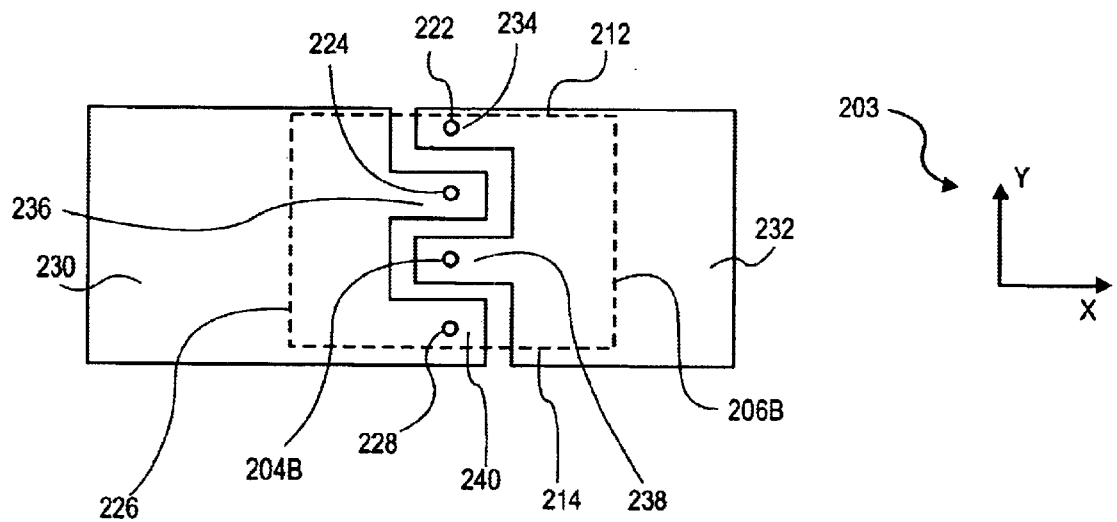

FIG. 2a provides a simplified, edge-view illustration of an embodiment of the present invention, and FIG. 2b provides a simplified, plan-view illustration of another embodiment.

For simplicity, FIGS. 2a and 2b do not show an integrated circuit die, FIG. 2a is oriented so that bypass capacitor 202 is viewed as on "top", and FIG. 2b does not show bypass capacitor 202. The spatial relationship between the views presented by FIGS. 2a and 2b is determined by noting that x-z plane 201 and x-y plane 203 belong to the same right-handed x-y-z coordinate system.

In FIG. 2b, dashed vertical lines 204b and 206b indicate the connections of terminals 204a and 206a to pads 208 and 210, respectively. In one embodiment, the dimension of capacitor terminals 204a and 206a in the y-axis direction is substantially equal to the corresponding dimension of pads 208 and 210. However, for purposes of illustration, in FIG. 2(b) the dimension of dashed lines 204b and 206b in the y-axis direction is shown as being slightly less than the corresponding dimension of pads 230 and 232.

For simplicity, FIG. 2a idealizes capacitor 202 as a lumped-parameter capacitor. Of course, capacitor 202 with terminals 204a and 206a has physical dimensions such that its geometric (perpendicular) projection onto a plane parallel to the package or die (i.e., the x-y plane) has a non-zero area. An example of a projection is indicated by the rectangle comprising dashed vertical lines 204b and 206b and dashed horizontal lines 212 and 214. However, projections need not be rectangular in shape.

As seen in FIG. 2a, vias 216 and 218 are within the projection of capacitor 202 onto a plane parallel to package 220. Similarly, in FIG. 2b, vias 222, 224, 226, and 228 also lie within the projection of the bypass capacitor. In these letters patent, it is to be understood that an object is said to lie underneath a capacitor if it lies within the projection of the capacitor onto a plane substantially parallel to the package to which the capacitor is connected or attached. For example, vias 222, 224, 226, and 228 are said to lie underneath capacitor 202.

In the embodiment of FIG. 2a, pads 208 and 210 are rectangular in shape, although in other embodiments the pads may have other shapes. In FIG. 2b, pads 230 and 232 have interposed digits 234, 236, 238, and 240. Placing vias within the projection of the bypass capacitor and forming pads having interposed digits facilitate in the reduction of loop inductance when compared to prior art methods, as well now be qualitatively described.

Loop inductance L is given by $$L = \frac{1}{I}\int B \cdot da,$$

where I is current through a loop, B is the magnetic induction vector, and the integral is over the loop area. In considering the above expression for loop inductance, comparison of prior art FIG. 3 with FIG. 4 shows qualitatively how embodiments of the present invention lead to lower power delivery loop inductance.

Figure 3:
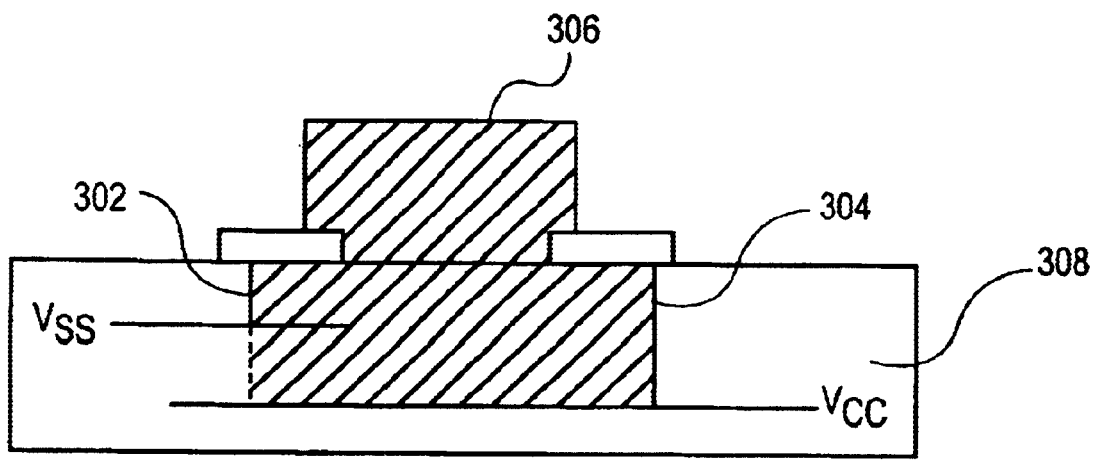
FIG. 3 illustrates loop inductance of a prior art package and land side capacitor.

FIG. 3 provides an edge view of a capacitor and package with rectangular pads. Capacitor 306 is modeled as a conductive plane parallel to package 308. The current flowing through capacitor 306 is actually a displacement current. In FIG. 3, vias 302 and 304 do not lie underneath capacitor 306. The relevant loop area for considering power delivery loop inductance is hatched in FIG. 3.

Figure 4:
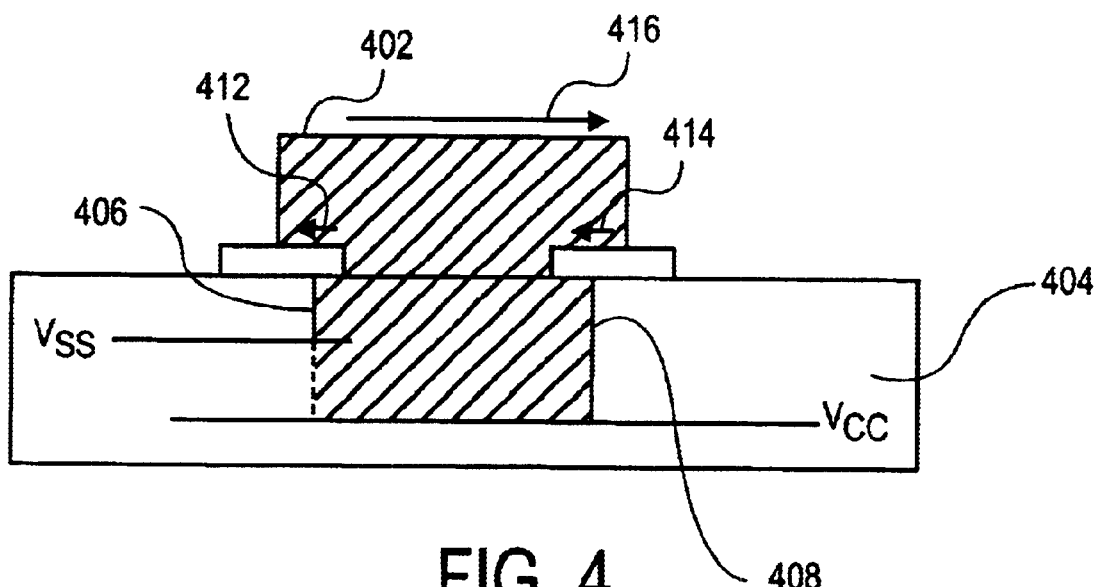
FIG. 4 illustrates loop inductance of an embodiment of the present invention.

Now consider an embodiment of the present invention illustrated in FIG. 4, where capacitor 402 is also modeled as a conductive plane parallel to package 404. In FIG. 4, vias 406 and 408 are now underneath capacitor 402. The relevant loop area for considering power delivery loop inductance is hatched in FIG. 4. This loop area is reduced when compared to a prior art, similarly dimensioned capacitor and package arrangement such as that shown in FIG. 3. Furthermore, consider the arrows illustrated in FIG. 4 which provide a qualitative description of current flow. Pad currents 412 and 414 are opposite in direction to capacitor displacement current 416, which leads to a reduction in the magnetic induction vector over most of the loop area. Consequently, the loop inductance of the embodiment illustrated in FIG. 4 is reduced when compared to a prior art, similarly dimensioned capacitor and package arrangement.

Furthermore, pads with interposed digits, as illustrated in FIG. 2b, lead to an increase in the mutual inductance between capacitor 202 and pads 230 and 232, as well as an increase in the mutual inductance between the two pads 230 and 232. An increase in these mutual inductances also reduces the power delivery loop inductance. A term of art describing the relationship of pads 230 and 232 is that they are "interdigitated".

Various packaging technology may be used in the embodiments of the present invention. For example, package 404 may be an OLGA (Organic Land Grid Array) or a FCPGA (Flip Chip Pin Grid Array). Various modifications may be made to the disclosed embodiments without departing from the scope of the invention as defined below.

What is claimed is:

1. An article of manufacture comprising:

a bypass capacitor; and an integrated circuit package comprising
a ground plane;
a power plane; and
first and second pads connected to the bypass capacitor, the bypass capacitor distinct from the first and second pads, wherein the first and second pads each have interposed digits, wherein at least one of the interposed digits in the first pad has a via to the ground plane and at least one of the interposed digits in the second pad has a via to the power plane.

2. The article of manufacture as set forth in claim 1, wherein the integrated circuit package comprises an organic land grid array.

3. The article of manufacture as set forth in claim 1, wherein the integrated circuit package comprises a flip chip pin grid array.

4. An article of manufacture comprising:

a package comprising:
a ground plane;
a power plane;
a first pad;
a first via coupling the first pad to the ground plane;
a second pad;
a second via coupling the second pad to the power plane; and
a bypass capacitor distinct from and connected to the first and second pads, wherein the first and second vias lie within the projection of the bypass capacitor onto a plane substantially parallel to the package.

5. The article of manufacture as set forth in claim 4, wherein the package comprises an organic land grid array.

6. The article of manufacture as set forth in claim 4, wherein the package comprises a flip chip pin grid array.

7. The article as set forth in claim 4, wherein the first and second pads have interposed digits.

8. The article as set forth in claim 4, wherein the bypass capacitor is a land side capacitor.

9. The article as set forth in claim 7, wherein the bypass capacitor is a land side capacitor.

10. An article of manufacture comprising:

a package comprising:
a ground plane;
a power plane;
a first pad;
a first via coupling the first pad to the ground plane;
a second pad;
a second via coupling the second pad to the power plane; and
a bypass capacitor distinct from and connected to the first and second pads, wherein the first and second vias are coupled to the first and second pads so that currents flowing in the first and second pads are substantially in opposite direction to displacement current flowing in the bypass capacitor.

11. The article of manufacture as set forth in claim 10, wherein the package comprises an organic land grid array.

12. The article of manufacture as set forth in claim 10, wherein the package comprises a flip chip pin grid array.

13. The article as set forth in claim 10, wherein the first and second pads have interposed digits.

14. The article as set forth in claim 10, where the capacitor is a land side capacitor.

* * * * *